US005545394A

United States Patent [19]

Doxsee

[11] Patent Number: 5,545,394

[45] Date of Patent: Aug. 13, 1996

[54] COMPLEXATION-MEDIATED CRYSTAL-FORMING REACTIONS USING COMPLEXING AGENTS

[75] Inventor: Kenneth M. Doxsee, Eugene, Oreg.

[73] Assignee: The State of Oregon Acting by and through the State Board of Higher Education on Behalf of the University of Oregon, Eugene, Oreg.

[21] Appl. No.: 104,863

[22] Filed: Aug. 10, 1993

[51] Int. Cl.[6] .............................. C01B 1/00; B01D 9/00; C01F 7/34; C22B 13/00

[52] U.S. Cl. ..................... 423/659; 23/295 R; 23/300; 23/305 R; 423/491; 423/179

[58] Field of Search ..................................... 423/491, 179, 423/659; 23/295 R, 300, 305 R

[56] References Cited

U.S. PATENT DOCUMENTS

| | | | |
|---|---|---|---|
| 4,308,031 | 12/1981 | Au | 423/179 |
| 4,347,230 | 8/1982 | Nicolau | 423/491 |
| 4,436,664 | 3/1984 | Gokel | 260/330.6 |
| 4,474,963 | 10/1984 | Gokel | 549/352 |
| 4,687,844 | 8/1987 | Gokel et al. | 540/467 |
| 5,320,822 | 6/1954 | Oziw et al. | 423/700 |

OTHER PUBLICATIONS

Doxsee et al., "Complexation-Mediated Crystallization of Sodium Acetate Trihydrate Needles from Cyclohexane Solution," *J. Inclusion Phenom.* 9:327–336 (1990).

Doxsee et al., "Unusual Coordination Number and Geometry in a Potassium 18–Crown–6 Complex," *J. Am. Chem. Soc.* 114:5165–5171 (1992).

Bianconi et al., "Crystallization of an Inorganic Phase Controlled by a Polymer Matrix," *Nature* 349:315–317 (1991).

Nicolau, "Solution Growth of Sparingly Soluble Single Crystals from Soluble Complexes—I. General Introduction," *J. Crystal Growth* 48:45–50 (1980).

Nicolau, "Solution Growth of Sparingly Soluble Single Crystals from Soluble Complexes—II. Growth of $\alpha$–$HgI_2$ Single Crystals from Iodomercurate Complexes," *J. Crystal Growth* 48:51–60 (1980).

Nicolau et al., "Solution Growth of Sparingly Soluble Single Crystals from Soluble Complexes—III. Growth of $\alpha$–$HgI_2$ Single Crystals from Dimethylsulfoxide Complexes," *J. Crystal Growth* 48:61–73 (1980).

Boulin, et al., "Gel–Growth of Silver Acetate Crystals," *J. Crystal Growth* 6:290–292 (1970).

Armington, et al., "Recrystallization by Shifting the Equilibrium of Chemical Complexes—The Growth of Cinnabar," *J. Crystal. Growth* 6:278–280 (1970).

Primary Examiner—Gary P. Straub
Attorney, Agent, or Firm—Klarquist Sparkman Campbell Leigh & Whinston, LLP

[57] ABSTRACT

Methods and reaction systems are disclosed that are adapted for forming crystallites having novel crystal habits and/or morphologies compared to conventional crystallites of the same chemical composition. The methods and reaction systems involve chemical reactions between at least two reactant compounds occurring in a liquid (or gel) that form insoluble crystallite products. At least one of the reactants is rendered soluble in a solvent in which the reactant is not normally soluble by adding an agent that forms soluble molecular complexes of the agent and the reactant. The complexing agent not only facilitates dissolution of the reactant in the solvent but also plays a role in how the faces of crystals comprising the crystallite product are enlarged during formation of the product. Products having such altered crystallite structure have a number of possible uses.

12 Claims, 5 Drawing Sheets

(FORMED BY PRIOR ART METHOD)

(FORMED BY PRIOR ART METHOD)

COMPLEXATION-MEDIATED CRYSTAL-FORMING REACTIONS USING COMPLEXING AGENTS

ACKNOWLEDGEMENT

Research that resulted in this invention was supported by grant nos. N00014-88-K-0006 and N-00014-91-J-1731 from the Office of Naval Research. The government has rights in this invention.

FIELD OF THE INVENTION

This invention pertains to methods of preparing new crystalline forms of various chemical compounds, both organic and inorganic.

BACKGROUND OF THE INVENTION

Interest in crystallization, and in various ways for altering the shapes and structures of crystals, has a long history. Efforts to modify crystallization processes so as to generate new crystalline forms of substances continue to be of considerable importance for various reasons including, for example, improvement of mass-handling characteristics of particulate materials, production of materials that are stronger or more durable than existing materials, and production of materials having improved physical characteristics such as light transmissivity.

One traditional way in which alteration of the shape (i.e., the "habit") or the crystal lattice (i.e., the "morphology") of a crystalline material has been achieved is by the use of additives. Weissbuch et al., *Science* 253:637–645 (1991); Addadi et al., *Topics in Stereochem.* 16:1–85 (1986); Addadi et al., *Angew. Chem. Int. Ed. Engl.* 24:466–485 (1985); and Addadi et al., *Nature* 296:21–26 (1982). Additive effects can be dramatic. A notorious example is the conversion of cubic NaCl to octahedral NaCl in the presence of traces of urea. Often, however, additives can incorporate into the crystals during growth, which is undesirable especially if a highly pure crystalline substance is needed.

Another traditional way to alter the habit or morphology of a crystalline material is by changing the crystallization solvent (including crystallization from the gas phase) used to dissolve the crystallization solute. Unfortunately, changing the crystallization solvent may not be possible because the crystallization solute must be soluble in the solvent employed and few alternative solvents may be available. For example, very polar solutes such as salts are typically crystallized from very polar solvents, especially water, because such solutes are insoluble in less polar solvents. Similarly, formation of materials for many electronic or optical uses (e.g., metal chalcogenides) via precipitation upon admixture of precursor salt solutions also requires very polar media in order to dissolve the precursor solutes. Although various ways of avoiding the requirement of aqueous solvents for the formation of such materials have appeared, these techniques often require the preparation of organoelement precursors or use of toxic and volatile inorganics and are far from being generally applicable.

Salts such as potassium chloride, which are freely soluble in water, are insoluble in non-polar solvents. Solvent effects on the alteration of crystal growth of such salts have not been explored to any great extent simply because one must dissolve the salt before it can be crystallized from solution.

Complexation using crown ethers provides a convenient method of solubilizing salts, in the form of their complexes, in non-polar solvents, as first reported by Pedersen, *J. Am. Chem. Soc.* 89.:2495–2496 (1967); see also, Pedersen, *J. Am. Chem. Soc.* 89:7017–7036 (1967). Doxsee et al., *J. Inclus. Phenom. & Molec. Recog. in Chem.* 9:327–336 (1990) reports the crystallization of a simple organic salt, sodium acetate, from cyclohexane solution in which sodium acetate is completely insoluble. The sodium acetate solute is solubilized as a crown-ether complex of the salt in the organic solvent. Slow evaporation of the solution results in precipitation of the free salt in crystalline form. When sodium acetate is conventionally crystallized from an aqueous solution, the crystals have a hexagonal plate habit. Crystallization of sodium acetate from the organic solution of its crown ether complex results in the formation of needle-shaped crystals. Despite their quite different crystal habits, the needles have an identical crystal lattice as the hexagonal crystals, as ascertained by x-ray diffraction analysis.

Thus, addition of complexation agents, such as crown ethers, solubilizes compounds in solvents in which the compounds would normally be completely insoluble. Initiation of crystallization then provides an opportunity to observe crystal growth under solvation conditions that are quite different from those of "normal" crystal-growth conditions.

Whereas crystallization of a simple inorganic salt from organic solution is intriguing, the method has substantial limitations. For example, it is limited to production of crystals of the particular solute already dissolved in the solution. Production of a large variety of other crystalline materials requires chemical reactions between reactants supplied by more than one solute.

Production of many commercially important compounds using conventional reaction technology is often difficult, hazardous, and/or expensive. Suitable reaction precursors (i.e., "reactants") may be unavailable or very expensive; the reactants may be highly toxic or flammable or have some other undesirable property such as extreme volatility. Finally, certain reactants are inefficient and generate undesired by-products or require additional process steps to obtain the desired product at a suitable purity level. For example, zinc selenide is conventionally produced by reacting dimethyl zinc with hydrogen selenide. Dimethyl zinc is expensive, extremely volatile, and pyrophoric. It would be advantageous if zinc selenide could be produced from an inorganic salt such as zinc chloride that is inexpensive and safe to use.

Therefore, there is a need for methods for producing, via a chemical reaction, materials having crystalline forms that are different in habit from crystalline materials produced by simple crystallization from solution. Materials having such different crystalline forms can be more suitable for particular applications.

There is also a need for such method permitting production of such crystalline forms using reactants that are less hazardous to work with compared to reactants that must be used in conventional reaction systems.

SUMMARY OF THE INVENTION

The foregoing needs are met by the present invention which provides methods and reaction systems for forming crystallite products.

According to one aspect of the present invention, such a method is provided wherein a first reactant is provided that is more soluble in a first solvent than in a second solvent. A second reactant is also provided that can react with the first reactant in the first solvent to form a crystallite product. In order to facilitate dissolution of the first reactant in the second solvent, a complexing agent is provided that is soluble in the second solvent and that can form molecular complexes with the first reactant. The first and second reactants along with the complexing agent are added to the second solvent, wherein the first and second reactants are allowed to react and form a crystallite product that is insoluble in the second solvent. The crystallite product formed by reaction in the second solvent, as facilitated by the complexing agent, comprises crystals that are different from crystals of the crystallite product that would otherwise be formable by reaction of the first and second reactants in the first solvent. Such differences are particularly evident as differences in crystal habit and/or morphology. Otherwise, the crystals formed in the second solution are typically (with few exceptions known at the present time) chemically identical to crystals found in the crystallite formed in the first solution.

Typically, in the foregoing method, the first solvent is polar and the second solvent is less polar than the first solvent. (Usually, the first solvent is water and the second solvent is an organic solvent). In such instances, the first and second reactants are typically salts that dissociate in the first solvent to form respective anions and corresponding cations.

According to another aspect of the present invention, a second complexing agent can be used, if required, to facilitate dissolution of the second reactant in the second solution.

According to another aspect of the present invention, the first reactant can be at least partially dissolved in a first solvent (using a complexing agent to facilitate said dissolution) to form a first solution, and a second reactant can be at least partially dissolved in a second solvent (using a complexing agent, if required, to facilitate dissolution) to form a second solution. The first and second solutions can be combined to trigger the crystallite-forming reaction.

Alternatively, a region consisting substantially of the first solution can be formed, contacting a region consisting substantially of the second solution, wherein an interface is formed between the regions. Reaction between the first and second reactants thus occurs at the interface, principally by diffusion, to form a crystallite product that is insoluble in either solution. In such an instance, the solutions can be either miscible or immiscible with each other.

According to another aspect of the present invention, reaction systems are provided that comprise a solvent, a first reactant normally poorly soluble to insoluble in the solvent, a first complexing agent dissolved in the solvent, and a second reactant capable of reacting with the first reactant in the solvent. The first complexing agent forms molecular complexes with the first reactant so as to facilitate dissolution of the first reactant in the solvent.

According to another aspect of the present invention, other reaction-system embodiments are possible, including embodiments in which two solutions are provided. In such embodiments, a first solution comprises a first reactant, a first solvent, and a complexing agent to which the first reactant is complexed so as to render the first reactant soluble in the solvent. A second solution comprises a second solvent and a second reactant at least partially soluble therein. The two solutions can be either mixed together or formed into two regions in contact with each other at an interface. As the first and second reactants react, a precipitate is formed in the mixture or at the interface, respectively.

According to yet another aspect of the present invention, one or both solutions (in reaction systems comprising two solutions) can be a gel. Alternatively, a gel can be placed between the first and second solutions which allows reactants to travel therethrough and can allow the crystallite product to be formed therein.

The foregoing embodiments of methods and reaction systems according to the present invention make possible the production of crystallites comprised of crystals having novel habit and/or morphology compared to crystallites formed in solvents in which the reactants are soluble without the use of complexing agents. As discussed herein, these novel crystallites have a large number of possible uses, depending upon the composition of the crystallites.

DETAILED DESCRIPTION

Figure 1:
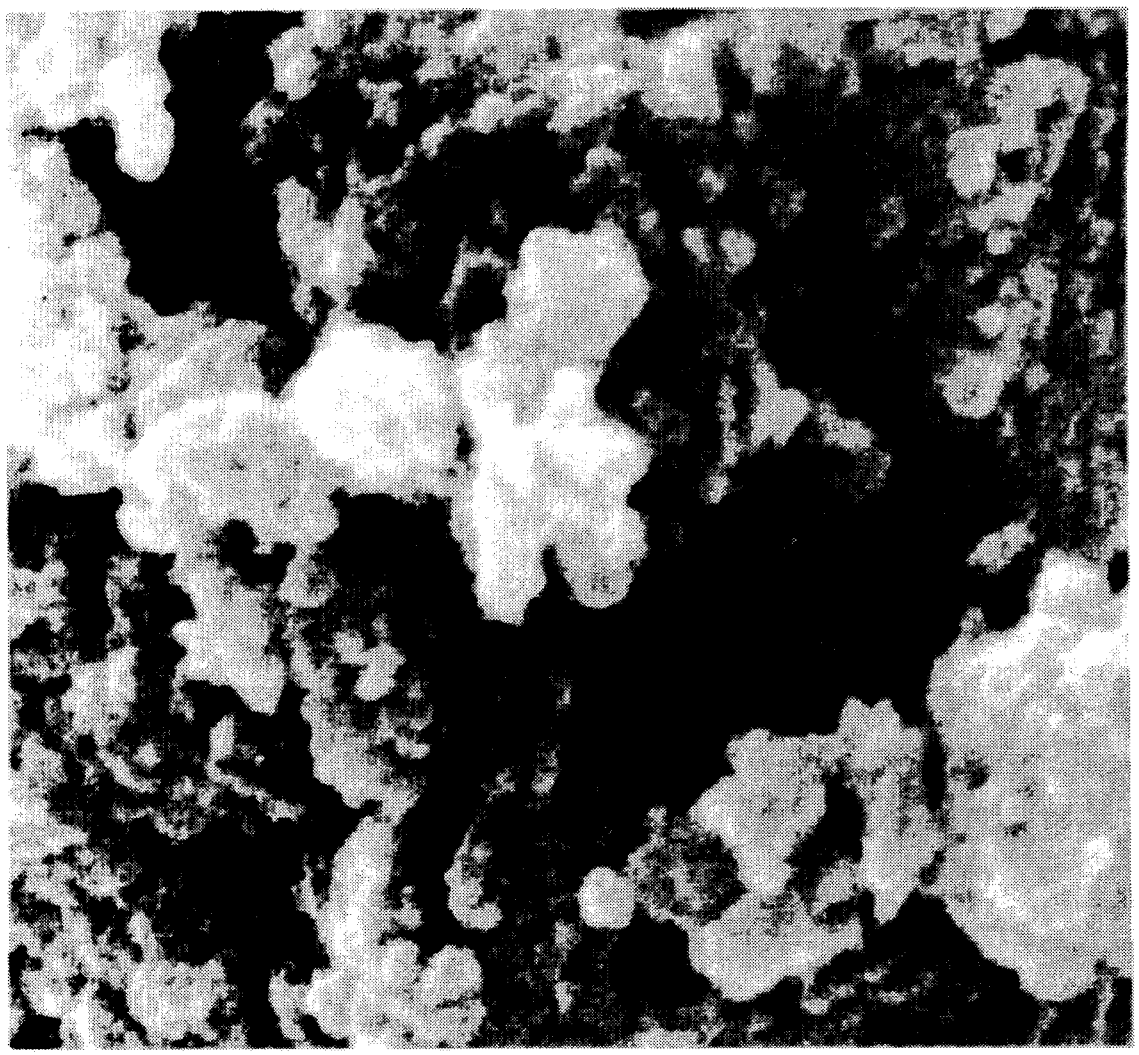
FIG. 1 is a scanning electron micrograph of gold-coated, apparently amorphous PbS formed according to the prior art in a water solution by reaction of lead (II) acetate with sodium sulfide as described in Example 5 (magnification 20,000×).

"Complex-mediated crystallization" has been reported. Doxsee et al., *J. Inclus. Phenom. & Molec. Recog. in Chem.* 9:327–336 (1990). According to such a method, a solute (sodium acetate) that is freely soluble in water but not normally soluble in the non-polar solvent cyclohexane was dissolved in cyclohexane by addition of a crown ether (15-crown-5) to the solvent. The crown ether was soluble in the solvent. Molecules of the crown ether formed complexes with the constituent sodium and acetate ions of the solute, thereby enabling the solute to "dissolve" (while still complexed with the crown ether) in the solvent. Subsequent evaporation of the solvent caused crystals of sodium acetate trihydrate to precipitate from the solution. The crystals were needle-shaped rather than the typical hexagonal plate habit produced by crystallization of this compound from an aqueous solution. However, the crystals had the same lattice parameters as hexagonal plate crystals of sodium acetate. The needle-crystal phenomenon was "explained" by the effect of the crown ether on the differential rates of solute adsorption on each of the faces of the sodium acetate crystals during crystal growth. In particular, it was hypothesized that the crown ether exerted a solvation effect on the relatively non-polar lateral faces (on which vander Waals contacts between methyl groups of the acetates apparently predominate). The crown ether exhibited very little solvation effect on the relatively polar axial faces (built up of alternating layers of $Na^+$ ions, water molecules, and acetate carboxylates). Thus, the axial faces were caused to grow more rapidly than the lateral faces.

The present invention provides a way to produce crystalline products (i.e., "crystallites") by chemical reactions, not merely by recrystallization from a solution. In a reaction according to the present invention, crystals of the product can have an unusual crystalline shape (crystal habit) and/or crystalline lattice structure (crystal morphology) compared to crystals of the product formed by conventional methods.

According to the present invention, a "reaction system" comprises at least two reactants, at least one solvent in which one or more of the reactants are to be dissolved (but in which at least one of the reactants to be dissolved is not normally freely soluble) and at least one chemical agent (i.e., a "complexing agent") suitable for effecting dissolution of the solute(s) in the solvent. The reactants, solvents, and complexing agents are discussed in further detail below.

As stated above, at least one of the reactants is normally, at least, poorly soluble to substantially insoluble in the corresponding solvent. In order to dissolve a sufficient amount of the reactant in the solvent and thereby render molecules of the reactant available for reaction, a chemical agent is employed having molecules that are soluble in the solvent and that form molecular complexes with the reactant. Hence, such an agent is termed a "complexing agent."

A chemical reaction according to the present invention involves molecules of at least two reactants. Molecules of the reactants are presented to each other for reaction either in a single solution containing molecules of both reactants (i.e., solutes) or in separate solutions that are brought into contact with each other. The solvents need not be miscible with each other. Thus, in each instance, the reactants interact with each other while in a dissolved condition, but not necessarily in the same solvent. Also, in cases in which two different solvents are used, one for each reactant, it is not necessary for one solution to be mixed with the other. Interaction of the reactants can occur solely by diffusion or, if the solvents are immiscible, at an interface between the solvents.

Whenever dissolution of a solute is facilitated by use of a complexing agent, it is not necessary that all the solute be dissolved before the onset of reaction. The complexing agent is typically not consumed during the reaction and can therefore serve as a "dissolution catalyst" for the corresponding solute. As solute molecules dissociate from molecules of the complexing agent and become incorporated into the crystalline product, the liberated molecules of the complexing agent become free to facilitate dissolution of more of the remaining unreacted solute. Thus, the complexing agent can be present in "catalytic" (i.e., substoichiometric) amounts.

The product of the reaction forms as one or more crystalline masses (crystallites) that precipitate and are thus readily separable from the solution(s) using conventional separation techniques. The crystallite can be comprised of visually discernable crystals or of crystals that are so small that the crystallite appears to be amorphous.

A key factor in determining whether or not a solute will dissolve in a solvent is the polarity of molecules of the solute relative to molecules of the solvent. In general, polar solutes (such as salts that dissociate into their constituent ions upon dissolution) are more soluble in polar solvents than in non-polar solvents; and non-polar solutes are more soluble in non-polar solvents compared to polar solvents. Thus, at a given temperature, a greater amount of a polar solute will dissolve in a polar solvent than in a relatively non-polar solvent. Likewise, a greater amount of a non-polar solute will dissolve in a non-polar solvent than in a polar solvent. The complexing agent, by bonding to the solute, alters the polarity of the solute, usually by making the solute molecules (or constituent ions) less polar.

In most instances and not intending to be limiting, at least one of the reactant solutes is normally soluble in water and has either limited solubility or is substantially insoluble in less polar solvents, including at least one of the solvents employed in the reaction. Thus, in such instances, at least one of the solvents is other than substantially pure water; i.e., a solvent substantially less polar than pure water. In order to dissolve the solute in such a solvent, a complexing agent is selected that is soluble in the solvent and that can form a complex with the solute to be dissolved in the solvent.

It is also possible according to the present invention for a solute reactant to be normally soluble in an organic solvent. In such an instance, a suitable complexing agent can be used to dissolve the solute in a water-containing solvent.

In a reaction system according to the present invention, it is possible for a first reactant to be soluble in the reaction solvent and a second reactant to have limited solubility in the solvent. In such an instance, the complexing agent is used to facilitate dissolution of the second reactant in the solvent.

Reaction systems according to the present invention also include systems in which both the first and second reactants require complexing agents for dissolution. The complexing agents can be the same or different. In a representative example of such a system, a first solution containing a first complexed reactant is layered atop a second solution containing a second complexed reactant, wherein the reaction occurs at the interface of the first and second solutions. Additional "phases" are also possible.

It is not necessary that the reaction system comprise a phase interface at all. "Single-phase" reactions involving a single solution containing all the reactants (and at least one complexing agent) are within the scope of the present invention.

The complexing agent performs at least one of the following roles: (a) solubilizing a reactant in a solvent; and (b) influencing the habit and/or morphology of the crystalline product formed, presumably by affecting the differential rates of growth on certain crystal faces but not others. In reaction systems in which both reactants, in the absence of the complexing agent, are insoluble in the solvent, the complexing agent generally performs both roles. In reaction systems in which one reactant is insoluble in the solvent and requires complexation with the agent in order to be dissolved in the solvent, but the other reactant is soluble in the solvent, the complexing agent again performs both roles. In reaction systems in which both reactants are soluble in the solvent, the complexation agent mainly serves the second role.

A molecule of the complexing agent facilitates dissolution of a reactant molecule by forming a complex with the reactant molecule. Due largely to the solubility of the complexing agent in the solvent employed, the resulting complex is also soluble in the solvent. Such complex formation can be exemplified by envisioning formation of a chelate, as known in the art, comprising a molecule of the complexing agent (serving as a chelating agent) interacting with a molecule of the reactant in a non-covalent way (i.e., by dative bonding) so as to form a coordination compound. In such a coordinating compound, an ion of the solute is attached by multiple coordination links to two or more usually non-metal atoms in the same complexing-agent molecule. Complexing agents offering two groups for attachment to the ion are termed "bidentate;" complexing agents offering three groups are termed "tridentate," and so on. The chemical groups on the complexing agent that participate in bonding of the solute are typically electiondonors. Complexing agents are also termed "ligands" in the art.

As can be surmised from the foregoing, since molecules of complexing agents typically have bonding groups that are electron donors, the regions of the corresponding solute molecules that become bonded to such complexing agents are electron acceptors. That is, the corresponding solute "molecules" typically are cationic, and can be actual polyatomic or monoatomic cations. It is also possible for the solute "molecules" to interact with the complexing agent by other bonding mechanisms such as hydrogen bonding.

It is also possible that the complexing agent, which interacts with the cationic aspect of the corresponding solute in a bonding way, also interacts with solutes in other ways to facilitate dissolution of the solute. For example, the complexing agent in a relatively non-polar solvent may interact with nonpolar regions of solutes by, for example, "hydrophobic" bonds.

The bonding of solute to the complexing agent must not be so strong that, during the crystallite-forming reaction, the solute cannot dissociate from the complexing agent. Release of solute from complexing agent molecules to form crystallite product must be energetically favorable.

Candidate complexing agents include, but are not limited to, the following: crown ethers (any of various cyclic polyethers in which the ether groups are connected by dimethylene or silicon linkages and the ether oxygen atoms serve as electron donors); ethylenediaminetetraacetic acid (EDTA) and analogs of this compound; nitrilotriacetic acid $N(CH_2COOH)_3$; ethyleneglycol-bis ($\beta$-aminoethylether)-N, N-tetraacetic acid $(HOOCCH_2)_2NCH_2CH_2OCH_2CH_2OCH_2CH_2N(CH_2COOH)_2$; diethylene-triaminepentaacetic acid (DTPA); desferroxamine and analogs thereof; ammine derivatives; metallocenes; hydroxycarboxylic acids, polyethylene glycols and corresponding dimethyl ethers; polyethyleneimine; tris-(methoxyethoxyethyl)amine and related compounds; and even kojic acid (which is a manganese chelator). Candidate crown ethers include, but are not limited to, 12-crown-4, 15-crown-5, 18-crown- 6, dicyclohexyl-18-crown-6, and dibenzo-18-crown-6. Each crown ether binds a particular range of cations, depending upon the size of the central cavity of the crown ether molecule. For example, 12-crown-4 binds $Li^+$ well but $K^+$ poorly; dibenzo-18-crown-6 binds $K^+$ well but $Li^+$ poorly. Similarly, dibenzo-18-crown-6 binds $Sr^{2+}$ and $Hg^{2+}$ well but $Ca^{2+}$, $Cd^{2+}$, $Zn^{2+}$ relatively poorly. Although crown ethers are conventionally used mostly for complexing simple cations, they can also complex amines, phenols, and other compounds.

The complexing agent can also be a "macrocyclic" compound which is essentially a crown-ether analog containing nitrogen or sulfur atoms or more than one kind of the hetero atom. Such compounds include bicyclic molecules that can surround an enclosed ion in three, rather than two, dimensions.

If one is having particular difficulty in achieving dissolution of a reactant, other possible complexing agents can be considered, such as any of various compounds termed "cryptands," including "spherands," "calixarenes," "cryptophanes," "hemispherands," "podands," and "lariat ethers." A number of proprietary complexing agents are also available.

The maximal amount of complexing agent to employ in a desired reaction system would be, for economic reasons, no greater than a stoichiometric amount relative to the amount of the corresponding reactant. Of course, if the complexing agent works "catalytically," substantially less than a stoichimetric amount would be required.

In general, crown ethers and "cryptophane" complexing agents work well for dissolving solutes containing alkalimetal cations. For solutes containing transition-metal cations, the crown ethers can be satisfactory, but complexing agents having electron donor atoms other than oxygen work better.

For a desired reaction, persons of ordinary skill in the art would be able to select a complexing agent that would perform the foregoing tasks. Many candidate complexing agents are commercially available and can be tested for efficacy in a given reaction by a simple test-tube experiment. It is also comprehended that many complexing agents, such as (but not limited to) crown ethers, can be made more soluble in certain hydrophobic solvents by chemically attaching lipophilic moieties to molecules of the agents.

Bench-top experiments to test the efficacy of a particular complexing agent are within the skill of persons of ordinary skill in the relevant art. For example, many candidate solutes form colored solutions. For such solutes, if color is absent, while using a particular complexing agent, then it is probably that substantially no dissolution occurred. For example, solutions containing chromates tend to be yellow; solutions of $CoCl_2$ tend to be dark blue. If the solution is naturally colorless, a precipitating anion can be added, using techniques of classical analytical chemistry, to see if a visible precipitate forms. For example, with solutions of nickel salts, addition of a $Na_2S$ solution will form a precipitate if the solution being tested contains any nickel ions. Of course, modern analytical techniques can also be employed to test for dissolution, such as atomic absorption spectroscopy.

With respect to reactant solutes that are normally soluble in water, candidate solvents for use in reaction systems according to the present invention include any of various solvents that are less polar than water, particularly relatively non-polar organic solvents. Such solvents include hydrophobic solvents and solvents that have some degree of hydrophilicity (normally less than water). Such solvents can also comprise mixtures of pure solvents. Such mixtures can include water. The solvent can also be one of the supercritical solvents, such as supercritical carbon dioxide.

Choosing a solvent can be somewhat empirical. Basically, if a solute cannot be made to dissolve in the solvent, even after attempting to facilitate dissolution using various complexing agents, a different solvent should be selected. Sometimes, difficulties with a solvent can be solved by simply using a different complexing agent. If dissolution of the solute is too slow, agitation can be helpful, including use of an ultrasonicator.

The solvent need not be a freely flowing liquid. It is also contemplated that the solvent can comprise, for example, a gel. In the usual instance where the solvent is non-polar, any of various nonpolar gels can be used, including any of various organic polymer gels such as, but not limited to, polystyrene gel and PVC gel. Use of gel solvents can have particular utility in two-phase reactions (i.e., reactions involving one solution layered atop another wherein the reaction occurs at the interface) according to the present invention, wherein the gel can serve to slow the rate of reaction and can simplify setting up the phases prior to onset of the reaction. Solvent-swollen organic polymers can also be used, which function similarly to a gel in reaction systems according to the present invention.

Inducing formation of a crystalline product in a reaction system according to the present invention can be, and usually is, spontaneous. However, crystallization can be triggered by introducing a seed crystal or other nucleation aid to the system. Other methods of inducing crystal formation include thermal shock, physical shock, and methods that achieve at least localized supersaturation.

The products of reactions according to the present invention are crystalline materials (i.e., "crystallites") and can be organic or inorganic. Such materials can comprise an assemblage of individual crystals that are microscopic in size. Generally, the faster the reaction, the smaller the crystals of the product.

The crystalline products of reactions according to the present invention are not necessarily comprised of crystals larger than products of corresponding reactions according to the prior art. Rather, the crystalline products of reactions according to the present invention have been found to exhibit an altered habit and/or morphology. In the case of reactions according to the present invention forming products consisting of smaller crystals, such crystallites can have unusual physical properties compared to crystallites consisting of larger crystals.

Preferred solutes usable according to the present invention are any of various water-soluble compounds that can react with other such compounds to form crystalline products. Such compounds are typically referred to as "salts" that can be dissociated to corresponding anions and cations. Representative cations and anions, not intended to be limiting, are listed in Tables I and II, respectively.

TABLE I

| Representative Cations | | |
|---|---|---|
| actinium | hydrogen | samarium |
| aluminum | indium | scandium |
| ammonium | iridium | selenium |
| antimony | iron | silicon |
| barium | lanthanum | silver |
| beryllium | lead | sodium |
| bismuth | lithium | sulfur |
| boron | magnesium | tantalum |
| cadmium | manganese | tellurium |
| calcium | mercury | terbium |
| cerium | molybdenum | thallium |
| cesium | neodymium | thorium |
| chromium | nickel | tin |
| cobalt | osmium | titanium |
| copper | palladium | tungsten |
| dysprosium | phosphorus | uranium |
| erbium | platinum | vanadium |
| gadolinium | potassium | ytterbium |
| germanium | rhenium | yttrium |
| gold | rhodium | zinc |
| hafnium | rubidium | zirconium |
| holmium | ruthenium | |

TABLE II

| Representative Anions | |
|---|---|
| acetate | hydrogen arsenate |

TABLE II-continued

| Representative Anions | |
|---|---|
| acetylide | hydrogen carbonate |
| aluminide | hydrogen fluoride |
| aluminum fluoride | hydrogen phosphate |
| arsenate | hydrogen selenite |
| arsenite | hydrogen sulfate |
| bicarbonate | hydrogen sulfide |
| biiodate | hydrosulfite |
| biphosphate | hydroxide |
| bismuth oxide | iodide |
| boride | iron oxide |
| bromate | metabisulfite |
| bromide | metaborate |
| carbide | niobium oxide |
| carbonate | metasilicate |
| chlorate | tantalum oxide |
| chloride | metatungstate |
| chloroacetate | molybdenum oxide |
| chlorodifluoroacetate | nitrate |
| chromate | nitride |
| chromite | nitrite |
| citrate | orthosilicate |
| cobalt oxide | oxalate |
| cyanotrihydroborate | oxide |
| dibromide dioxide | pentacyanonitrosylferrate |
| dichloride dioxide | perborate |
| dichromate | perchlorate |
| diethyldithiocarbamate | peroxydisulfate |
| dihydrogen diphosphate | perrhenate |
| dihydrogen phosphate | phosphate |
| disulfite | sulfate |
| dithionate | tartrate |
| iron oxide | pyrophosphate |
| ferricyanide | selenate |
| fluoride | selenide |
| fluorophosphate | selenite |
| formate | sulfate |
| hexabromoiridate | sulfide |
| hexabromoplatinate | sulfite |
| hexachloroiridate | tartrate |
| hexachloroosmiate | tellurate |
| hexachloropalladate | telluride |
| hexachloroplatinate | tetraborate |
| hexachlororhodate | tetrachloroaluminate |
| hexafluoroaluminate | tetrachloraurate |
| hexafluoroarsenate | tetrachlorpalladate |
| hexafluoroferrate | tetrachloroplatinate |
| hexafluorophosphorus | tetrafluorborate |
| hexafluorosilicate | thiocyanate |
| hexafluorotitanate | thiophosphate |
| hexahydroplatinate | thiosulfate |
| hexametaphosphate | tin oxide |
| hexanitrocobaltate | titanium oxide |
| hexanitroiridate | triphosphate |
| hydride | tungsten oxide |
| | vanadium oxide |
| | zirconium oxide |

The present invention can have utility in any application in which altered crystal form is a benefit. The following are representative applications and are not intended to be limiting in any way:

(a) Production of composite materials having novel or improved properties: For example, ZnS is transparent to infrared radiation. Unfortunately, ZnS in its currently available form is brittle. The present invention allows one to produce ZnS having an unconventional crystalline habit, such as fibrous ZnS crystals, that could be used to make composite materials having infrared transparency and that are less brittle.

(b) Production of improved photographic emulsions: Silver halide is a key ingredient in photographic emulsions. Alterations in crystal shape of this compound would likely be instrumental in improving the resolution, for example, of photographic films.

(c) Explosives: In crystalline materials having explosive properties, it is usually desirable that the energy density of the crystal lattice of such a material be as high as possible. The present invention makes it possible to form explosive compounds having altered crystal habit and morphology, and therefore altered energy density, such as any of various explosive ammonium compounds.

(d) Non-linear optical materials: Reaction systems according to the present invention can utilize so-termed "assymmetric" solvents which can be utilized to generate assymmetric crystalline products having possible utility as non-linear optical materials. For example, organic compounds often display very high nonlinear optical properties. High polarizability of an organic molecule frequently contributes to enhanced non-linear properties (e.g., p-nitroaniline). Unfortunately, the vast majority of organic compounds crystallize in centrosymmetric space groups, eliminating them as non-linear materials. Simply varying the solvent according to conventional methods in order to alter crystal habit or morphology is often limited, particularly for many of the more polarizable compounds of interest which are largely only soluble in quite polar media. Reaction systems according to the present invention can be used to eliminate these problems.

(e) Semiconductors and other electronic materials: Formation of metal chalcogenides, such as CdSe, ZnS, and ZnSe, is conventionally performed using ionic precursors including, e.g., $CdSO_4$ and $Na_2Se$. As a result, these preparations are conventionally carried out in the condensed phase in aqueous solvents. Conventional technology also includes schemes for making such compounds utilizing gas-phase reactions or organic solvents. But, these methods often entail use of volatile and toxic precursors such as $H_2Se$ and $CdMe_2$. The present invention permits solubilization of ionic-precursor compounds via complexation, followed by slow diffusion of reacting solutions leading to precipitation or crystallization of the desired product from solvents that have heretofore not been accessible due to the insolubilities of the reacting species. For example, sulfide, selenide, and telluride can be solubilized in hydrocarbon and ethereal solvents through formation of crown-either complexes of their lithium, sodium, or potassium salts. Commercially available crown ethers can also solubilize a number of salts of metal ions of interest, including $Hg^{2+}$, $Cd^{2+}$, and $Pb^+$. Simple synthetic complexation agents can be readily prepared to solubilize a number of other relevant ions. See, e.g., Lindoy, *The Chemistry of Macrocyclic Ligand Complexes*, Cambridge Univ. Press (1989). Thus, codiffusion of reactant solutions can result in formation of the corresponding metal chalcogenides.

The present invention also makes it possible to form semiconductor materials, such as CdS and ZnS, comprising very small crystallites. Such materials are currently the subject of considerable research pertaining to "quantum dot" or "quantum-confined" systems. The present invention also makes possible the synthesis of photocatalytically active semiconductor crystallites having altered properties.

(f) Lubricants: Certain metal sulfides such as $MoS_2$ and $WS_2$ are useful as lubricants whose properties are dependent upon the crystal habits and morphologies of these compounds. The present invention makes it possible to modify the crystal forms of these compounds in possibly beneficial ways.

(g) Display technology: Certain crystallites that can be formed according to the present invention, such as $TiS_2$ and $ZrS_2$, are particularly useful for high-resolution video display technology.

(h) Biological/medical applications: A number of medically important salts can be synthesized according to the present invention, wherein the crystalline habit and morphology of such materials can be beneficially altered. In nature, a number of crystallites of inorganic or predominantly inorganic nature are formed in non-aqueous environments and are therefore difficult to duplicate using conventional aqueous systems. (See, e.g., Bianconi et al., *Nature* 349:315–317 (1991).) The present invention, in which new forms of crystallites can be produced by reactions in non-aqueous environments, offers the capability of producing materials that more closely mimic what is produced in nature.

(i) Production of materials having altered bulk properties as a result of changes in crystal habit or morphology of the material (but not the chemical composition of the material): Changes in crystallites made possible by the present invention can yield beneficial alterations in packing behavior, e.g., making particulate materials in a form that is less likely to result in clumping or packing; i.e., having more "free-flow" characteristics.

The following examples are provided:

EXAMPLES 1–35

These Examples pertain to reactions involving catalytic solubilization of a solute in a single-solvent phase.

Stoichiometric amounts of solid comminuted reactants as set forth in Table III were mixed with the corresponding anhydrous organic solvent (Table III), either with or without a complexing agent (the crown ether dibenzo-18-crown-6). In view of the rather sparing solubility of heavy-metal complexes of dibenzo-18-crown-6, suspensions of the solid metal salt and sodium sulfide were stirred in the corresponding organic solvent with a "catalytic" amount of the complexing agent. Crystalline products produced with and without the complexing agent were examined by scanning electron microscopy and x-ray powder diffraction (see, e.g., Hilgenfeld et al., *Top. Curr. Chem.* 101:1–82 (1982)) and compared with crystalline products produced in controls containing water solvent (Examples 5, 10, 15, 20, 25, 30, and 35) or controls containing no complexing agent (e.g., Examples 1c, 2c, 3c, and 4c). Reaction temperature was ambient room temperature. Crystalline products were harvested from the solvent liquid using conventional techniques. After harvesting, the crystals were washed using additional solvent lacking the complexing agent.

TABLE III

| Example | Solvent | Complexing Agt | Reactants | Product |
|---|---|---|---|---|
| 1 | THF | dibenz-18-C-6 | Pb(OAc)$_2$ + Na$_2$S | PbS |
| 1c | THF | none | " | PbS |
| 2 | toluene | dibenz-18-C-6 | " | PbS |
| 2c | toluene | none | " | PbS |
| 3 | N,N-DMF | dibenz-18-C-6 | " | PbS |
| 3c | N,N-DMF | none | " | PbS |
| 4 | acetonitrile | dibenz-18-C-6 | " | PbS |
| 4c | acetonitrile | none | " | PbS |
| 5 | water | none | " | PbS |
| 6 | THF | dibenz-18-C-6 | HgCl$_2$ + Na$_2$S | HgS |
| 7 | toluene | " | " | HgS |
| 8 | N,N-DMF | " | " | HgS |

TABLE III-continued

| Example | Solvent | Complexing Agt | Reactants | Product |
|---|---|---|---|---|
| 9 | acetonitrile | " | " | HgS |
| 10 | water | none | " | HgS |
| 11 | THF | dibenz-18-C-6 | $ZnCl_2 + Na_2S$ | ZnS |
| 12 | toluene | " | " | ZnS |
| 13 | N,N-THF | " | " | ZnS |
| 14 | acetonitrile | " | " | ZnS |
| 15 | water | none | " | ZnS |
| 16 | THF | dibenz-18-C-6 | $Mn(OAc)_2 + Na_2S$ | MnS |
| 17 | toluene | " | " | MnS |
| 18 | N,N-DMF | " | " | MnS |
| 19 | acetonitrile | " | " | MnS |
| 20 | water | none | " | MnS |
| 21 | THF | dibenz-18-C-6 | $FeCl_2 + Na_2S$ | FeS |
| 22 | toluene | " | " | FeS |
| 23 | N,N-DMF | " | " | FeS |
| 24 | acetonitrile | " | " | FeS |
| 25 | water | none | " | FeS |
| 26 | THF | dibenz-18-C-6 | $Cu(OAc)_2 + Na_2S$ | CuS |
| 27 | toluene | " | " | CuS |
| 28 | N,N-DMF | " | " | CuS |
| 29 | acetonitrile | " | " | CuS |
| 30 | water | " | " | CuS |
| 31 | THF | dibenz-18-C-6 | $CdCl_2 + Na_2S$ | CdS |
| 32 | toluene | " | " | CdS |
| 33 | N,N-DMF | " | " | CdS |
| 34 | acetonitrile | " | " | CdS |
| 35 | water | none | " | CdS |

In Table III, "THF" is anhydrous tetrahydrofuran, "N,N-DMF" is anhydrous N,N-dimethylformamide, and "dibenz-18-C-6" is the crown ether dibenzo-18-crown-6.

Dibenzo-18-crown-6 was chosen as an inexpensive, commercially available crown ether displaying somewhat enhanced lipophilicity compared to the parent crown ether, 18-crown-6. Despite this enhanced lipophilicity, the heavy metal salt complexes of dibenzo-18-crown-6 displayed only a limited solubility in common organic solvents.

Figure 2:
FIG. 2 is a scanning electron micrograph of gold-coated crystalline PbS formed according the present invention in a solution of anhydrous tetrahydrofuran with dibenzo-18-crown-6 as described in Example 1 (magnification 10,000×).

In all the foregoing examples, crystalline product formed in the corresponding organic solvent. However, presence of the complexing agent in the organic solvent generally resulted in the formation of more clearly defined crystals than were observed in the organic solvent lacking the complexing agent. In addition, crystals formed in an organic solvent with the complexing agent were substantially more defined than the crystalline products formed in an aqueous solvent. For example, in Example 5, precipitation of PbS by admixture of aqueous solutions of lead (II) acetate and sodium sulfide yielded a nearly amorphous precipitate as observed under scanning electron microscopy (FIG. 1). X-ray powder diffraction analysis revealed that the precipitate comprised extremely fine crystals of cubic-phase lead sulfide commonly known as "galena." Precipitation of PbS from anhydrous tetrahydrofuran (Example 1c) in the absence of complexing agent yielded a microcrystalline product that was qualitatively similar to the product of Example 5. In contrast, the presence of a catalytic amount of dibenzo-18-crown-6 (Example 1) in the anhydrous THF yielded precipitate exhibiting much greater crystallinity (FIG. 2), thereby providing a dramatic example of the impact of complexation on the formation of crystalline product from a reaction according to the present invention.

Examples 2c, 3c, and 4c, which lacked the complexation agent, exhibited formation of a microcrystalline galena product similar to Examples 1c and 5. In Examples 2–4, the presence of the complexing agent resulted in formation of PbS product that was coarser and had a distinctive crystal structure. Also, the crystals obtained in the presence of complexing agent were affected by the choice of solvent. In particular, crystals obtained in DMF were more prismatic than crystals obtained in toluene or THF. Therefore, the qualitative yield of crystalline product depended upon not only the coordinating ability of the complexing agent but also upon the solvent.

The remaining examples that included a complexing agent (i.e., Examples 6–9, 11–14, 16–19, 21–24, 26–29, and 31–34) exhibited results that were similar to, but less pronounced than, the results obtained with PbS.

The foregoing results also indicate that the complexing agent serves not only to enhance solubility of the reactants in the solvent(s) but also exerts an influence on crystal shape and size of the product of the reaction.

EXAMPLES 36–38

These Examples, shown in Table IV, were an investigation of a reaction according to the present invention occurring in a two-phase solvent-solvent reaction system.

TABLE IV

| Ex. | Solvent | Complexing Agt | Reactants | Product |
|---|---|---|---|---|
| 36 | water | none | $HgCl_2 + Na_2S$ | metacinnabar |
| 37 | t: water | none | $HgCl_2$ | |
|  | b: meth. chlor. | none | $Na_2S$ | metacinnabar |
| 38 | t: water | none | $HgCl_2$ | cinnabar and |
|  | b: meth. chlor. | d-18-C-6 | $Na_2S$ | metacinnabar |

Figure 3:
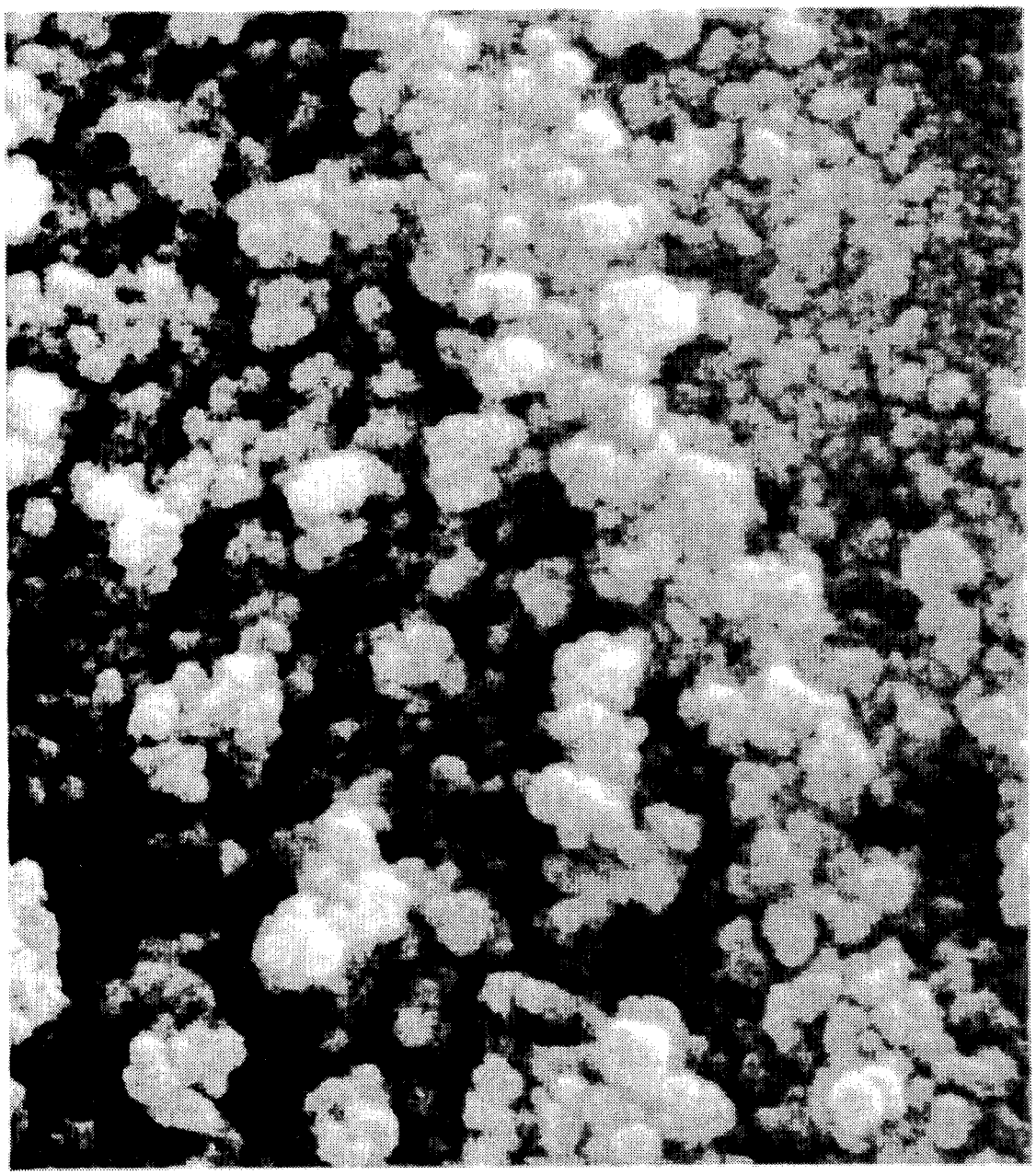
FIG. 3 is a scanning electron micrograph of gold-coated, apparently amorphous HgS formed according to the prior art in a water solution by reaction of mercuric chloride and sodium sulfide as described in Example 36 (magnification 20,000×).
Figure 4:
FIG. 4 is a scanning electron micrograph of gold-coated crystalline HgS formed according to the present invention in a two-phase system in which crownether (dibenzo-18-crown-6) solubilized sodium sulfide in methylene chloride was layered with an aqueous solution of mercuric chloride as described in Example 38 (magnification 10,000×).

In Table IV, "t" signifies the top phase layer in the reaction system, and "b" signifies the bottom phase layer; "d-18-C-6" signifies the complexing agent dibenzo-18-crown-6; and "meth. chlor." signifies methylene chloride. In Example 36, which served as a control, the reaction system comprised $HgCl_2$ and $Na_2S$ in aqueous solution. The reaction system of Example 37 comprised a top phase containing an aqueous solution of $HgCl_2$, and a lower phase consisting essentially of a mixture of chloroform and methylene chloride solvents, with $Na_2S$ dissolved in the lower phase. The reaction system of Example 38 was the same as Example 37 except that the complexing agent 18-crown-6 was also present in the lower phase. In all three reaction systems, a precipitate formed at the interface of the liquid phases. In Examples 36 and 37, the precipitate when viewed by scanning electron microscopy appeared substantially amorphous (FIG. 3) and consisted only of metacinnabar. In Example 38, the precipitate consisted of about equal amounts of cubic metacinnabar and hexagonal cinnabar crystals. In addition, the crystals were substantially coarser with clearly defined faceting (FIG. 4).

Figure 5:
FIG. 5 is an optical photomicrograph showing whisker-like crystallites of cinnabar formed after prolonged reaction of the system that generated the crystallites shown in FIG. 4 (Example 38).

On prolonged contact time with Example 38, macroscopic crystals of cinnabar were obtained in the form of fibrous bundles of whisker-like crystallites, as shown in FIG. 5.

Thus, the presence of the complexing agent in this reaction system facilitated the production of substantially altered crystal forms of HgS.

EXAMPLES 39–40

In these Examples, homogeneous solutions of mercuric iodide ($HgI_2$) and sodium sulfide ($Na_2S$) were prepared in dimethylsulfoxide (DMSO) either with (Example 40) or without (Example 39) the complexing agent dibenzo-18-crown-6. The crystalline precipitate formed in Example 39 consisted of metacinnabar only. The crystalline precipitate formed in Example 40 consisted of equal amounts of cinnabar and metacinnabar.

EXAMPLES 41–44

These Examples constitute investigations into reaction systems according to the present invention that pertain to crystalline product formation in a gel.

In Examples 41 and 42, PVC (polyvinylchloride) gels in DMF solvent were prepared using conventional techniques. The gels also contained dissolved $HgCl_2$. The gels were overlaid with DMF also containing $Na_2S$ and either containing dibenzo-18-crown-6 as a complexing agent (Example 42) or lacking a complexing agent (Example 41). After allowing for diffusion to occur in the gels at room temperature, a precipitate was observed in each. Subsequent washing with DMF caused the gel to dissolve, thereby permitting harvesting of the precipitate. When formed in the presence of the complexing agent (Example 42), the precipitate comprised prismatic crystals of HgS. When formed in the absence of the complexing agent (Example 41), the precipitate lacked any visible crystalline structure.

In Examples 43 and 44, similar gels were produced as in Examples 41 and 42 except that, in Examples 43 and 44, DMSO was used as the gel solvent. The gels also contained dissolved $HgCl_2$. The gels were overlaid with DMSO also containing $Na_2S$ and either containing dibenzo-18-crown-6 as a complexing agent (Example 44) or lacking a complexing agent (Example 43). After allowing for diffusion to occur in the gels at room temperature, a precipitate was observed in each. The gels were dissolved and the precipitate collected. In both Examples, the precipitate appeared similar, with little crystallinity. These results suggest that both the solvent and the complexing agent play a role in determining the crystallinity of the product in reaction systems according to the present invention.

EXAMPLES 45–46

In these examples, an aqueous solution of $CaCl_2$ was placed on one side of a PVC-DMSO gel. An aqueous solution of $(NH_4)_2CO_3$ was placed on the opposite side of the gel. The gel either contained the complexing agent dibenzo-18-crown-6 (Example 46) or lacked any complexing agent (Example 45). The solutions were allowed to diffuse through the gel for a sufficient amount of time to react with each other. In Example 45, no precipitate formed at all. In Example 46, in contrast, $CaCO_3$ crystals were formed in the gel.

EXAMPLES 47–48

In these Examples, a two-phase reaction system was investigated and found to effect a deprotonation reaction in which solvent served as a reactant. In Example 47, an aqueous solution of dipotassium tartrate was layered above a solution of 18-crown-6 in methylene chloride. Upon prolonged contact of these two solutions, single crystals appeared at the interface. Infrared, nuclear magnetic resonance, and solubility analysis of the precipitate indicated that the crystals were not dipotassium tartrate but rather potassium hydrogen tartrate. This was confirmed by single-crystal x-ray diffraction analysis. In contrast, recrystallization of dipotassium tartrate from water (Example 48) did not form potassium hydrogen tartrate but rather re-formed dipotassium tartrate crystals. Apparently, solubilization of tartrate in the methylene chloride solvent, where the tartrate behaves as a stronger base, may be responsible for the formation of the monoprotonated salt precipitate. Interestingly, the prismatic crystal form displayed by the potassium hydrogen tartrate formed in Example 47 was distinct from the crystal form of the same salt crystallized from water.

EXAMPLE 49

This Example was similar to Example 47, except that carbon tetrachloride was used as the solvent rather than methylene chloride. The resulting precipitate was comprised of block-shaped crystals of potassium hydrogen tartrate.

EXAMPLES 50–51

These Examples were an investigation of crystal formation according to the present invention using solvents containing water (i.e., solvents not consisting essentially of pure water). Examples 50 and 51 comprised the preparation of two samples of silver chromate ($Ag_2CrO_4$) by admixture of solutions of $AgNO_3$ and $K_2CrO_4$.

In Example 50, which served as a control, an $AgNO_3$ solution in water was added dropwise to a solution of $K_2CrO_4$ in water, resulting in immediate precipitation of a red-brown powder. The powder was isolated by filtration, washed with water, washed with ethanol, and washed with diethyl ether, yielding $Ag_2CrO_4$ as a brown powder in a high yield.

In Example 51, $AgNO_3$ was dissolved in 0.5 mL water, then diluted with 4 mL ethanol. This solution was added dropwise to 6 mL of a solution of $K_2CrO_4$ in ethanol containing three equivalents of 18-crown-6, resulting in immediate precipitation of a red powder. (Note: $K_2CrO_4$ appears to be completely insoluble in ethanol in the absence of 18-crown-6.) The powder was isolated by filtration, washed with ethanol, washed with water, washed with ethanol, and washed with diethyl ether, yielding $Ag_2CrO_4$ as a red powder in high yield.

The brown powder of Example 50 and the red powder of Example 51 were examined by x-ray powder diffraction and were found to be the known orthorhombic phase of $Ag_2CrO_4$. Each powder appeared crystalline. However, Example 50 (prepared from water) appeared to be composed of significantly larger crystallites, as evidenced by sharper lines in the powder diffraction pattern. Scanning electron microscopy confirmed the x-ray powder diffraction results: Example 50 consisted entirely of apparently well-faceted crystallites having a mean diameter of about 0.5 to 1.0 µm. Example 51 displayed a crystallite structure in which individual crystals were substantially smaller than Example 50, so small as to confer an almost amorphous appearance to the crystallite.

Although Example 51 in this instance yielded crystals that were smaller than the control (Example 50), these Examples again show that crystallization of reaction product from a solution containing a complexing agent used to facilitate dissolution of at least one reactant yielded an alteration of the crystalline form of the product compared to controls lacking the complexing agent. In fact, these Examples illustrate that the present invention can have particular utility for use in making "quantum dots" or "nanoparticles," many of which display a number of unusual properties of potential significance in contemporary technology.

EXAMPLES 52–54

These Examples are an investigation of the use of complexing agents other than crown ethers.

Each of the following Examples involved the use of tris(methoxyethoxyethyl)amine: $N(CH_2CH_2OCH_2CH_2OCH_3)_3$ as a complexing agent. This complexing agent (or any of various other complexing agents that could have been used) was necessary in order to achieve dissolution of sufficient amounts of $AgNO_3$ in diethyl ether so as to form satisfactory amounts of reaction product.

In Example 52, $AgNO_3$ was dissolved in diethyl ether containing tris(methoxyethoxyethyl)amine. This solution was layered into an aqueous solution of $K_2CrO_4$, resulting in formation of red-brown $Ag_2CrO_4$ at the interface between the solutions.

In Example 53, $AgNO_3$ was dissolved in diethyl ether containing tris(methoxyethoxyethyl)amine. This solution was layered onto an aqueous solution of NaBr, resulting in formation of white AgBr at the interface between the two solutions.

In Example 54, $AgNO_3$ was dissolved in diethyl ether containing tris(methoxyethoxyethyl)amine. This solution was layered onto an aqueous solution of $(NH_4)_2MoO_4$, resulting in formation of white $Ag_2MoO_4$ at the interface between the two solutions.

What is claimed is:

1. A method for forming a crystallite product, comprising:
   (a) providing a first reactant salt that is substantially soluble in water but is poorly soluble to insoluble in an organic solvent;
   (b) providing a second reactant salt that can react with the first reactant salt in water to form a first crystallite of a product compound, the first and second reactant salts being selected from a group consisting of acetates of Group-IB, group-IIB, group-IVA, group-VIIB, and group-VIII elements of the periodic table, sulfides of group-IA elements of the periodic table, halides of group-IA, group-IIA, group-IIB, and group-VIII elements of the periodic table, chromates of group-IA elements of the periodic table, silver nitrate, ammonium molybdate, ammonium carbonate, and dipotassium tartrate;
   (c) providing a complexing agent that is soluble in the organic solvent and that can form molecular complexes with the first reactant salt so as to facilitate dissolution of the first reactant salt in the organic solvents, the complexing agent selected from a group consisting of crown ethers and tris(methoxyethoxyethyl)amine;
   (d) adding relative amounts of the first and second reactant salts along with the complexing agent to the organic solvent, the relative amounts being sufficient for reaction of the first and second reactant salts with each other to form a desired amount of the product compound; and
   (e) allowing the first and second reactant salts to react with each other in the organic solvent to form a second crystallite that is insoluble in the oganic solvent and that comprises crystals of the product compound that have a different habit or morphology from crystals of the product compound in the first crystallite that would otherwise be formable in water by reaction of similar relative amounts of the first and second reactant salts in water without the complexing agent.

2. A method as recited in claim 1 wherein the first and second reactant salts dissociate in water to form respective anions and corresponding cations.

3. A method as recited in claim 1 wherein the organic solvent is selected from a group consisting of tetrahydrofuran, toluene, N,N-dimethylformamide, acetonitrile, methylene chloride, dimethylsulfoxide, carbon tetrachloride, and diethyl ether.

4. A method as recited in claim 1 wherein the organic solvent is substantially non-polar.

5. A method as recited in claim 1 wherein the organic solvent is a gel.

6. A method as recited in claim 1 wherein, in step (e), the crystals of the product compound in the second crystallite have a different crystalline habit than the crystals of the product compound in the first crystallite.

7. A method as recited in claim 1 wherein, in step (e), the crystals of the product compound in the second crystallite have a different crystalline morphology than the crystals of the product compound in the first crystallite.

8. A method as recited in claim 1, wherein the second reactant salt is soluble in water.

9. A method for forming a crystallite product, comprising:
   (a) providing a first reactant salt that is substantially soluble in water but is poorly soluble to insoluble in an organic solvent;
   (b) providing a second reactant salt that can react with the first reactant salt in water to form a first crystallite of a product compound, the second reactant salt being more soluble in water than in the organic solvent, the first and second reactant salts being selected from a group consisting of acetates of group-IB, group-IIB, group-IVA, group-VIIB, and group-VIII elements of the periodic table, sulfides of group-IA elements of the periodic table, halides of group-IA, group-IIA, group IIB, and group-VIII elements of the periodic table, chromates of group-IA elements of the periodic table, silver nitrate, ammonium molybdate, ammonium carbonate, and dipotassium tartrate;
   (c) providing a first complexing agent that is soluble in the organic solvent and that can form molecular complexes with the first reactant salt so as to facilitate dissolution of the first reactant salt in the organic solvent, the first complexing agent being selected from a group consisting of crown ethers and tris(methoxyethoxyethyl)amine;
   (d) adding relative amounts of the first and second reactant salts along with the first complexing agent to the organic solvent, the relative amounts being sufficient for reaction of the first and second reactant salts with each other to form a desired amount of the product compound; and
   (e) allowing the first and second reactant salts to react with each other in the organic solvent to form a second crystallite by reaction of the first and second reactant salts in the organic solvent, the second crystallite being insoluble in the organic solvent and comprising crystals of the product compound that have a different habit or morphology from crystals of the product compound in the first crystallite that would otherwise be formable in water by reaction of similar relative amounts of the first and second reactant salts in water without the complexing agent.

10. A method as recited in claim 9 further comprising the step (c), of providing a second complexing agent that is soluble in the organic solvent, the second complexing agent being comprised of molecules that can form molecular complexes with the second reactant salt, thereby enabling the second complexing agent to facilitate dissolution of the second reactant salt in the organic solvent, the second complexing agent selected from a group consisting of crown ethers and tris(methoxyethoxyethyl)amine, and the organic solvent being selected from a group consisting of tetrahydrofuran, toluene, N,N-dimethylformamide, acetonitrile, methylene chloride, dimethylsulfoxide, carbon tetrachloride, and diethyl ether.

11. A method as recited in claim 9 further comprising, before step (d), providing a second complexing agent soluble in the organic solvent and with which second complexing agent the second reactant salt can form molecular complexes that facilitate solubility of the second reactant salt in the organic solvent.

12. A method for forming a crystallite product, comprising:
   (a) adding a first reactant salt, a second reactant salt, and a complexing agent to an organic solvent, the first reactant salt being substantially soluble in the water but poorly soluble to insoluble in the organic solvent, the second reactant salt being able to react with the first reactant salt in water to form a first crystallite of a product compound, the first and second reactant salts being selected from a group consisting of acetates of group-IB, group-IIB, group-IVA, group-VIIB, and group-VIII elements of the periodic table, sulfides of group-IA elements of the periodic table, halides of group-IA, group-IIA, group IIB, and group-VIII elements of the periodic table, chromates of group-IA elements of the periodic table, silver nitrate, ammonium molybdate, ammonium carbonate, and dipotassium tartrate, and the complexing agent being soluble in the organic solvent and being selected from a group consisting of crown ethers and tris(methoxyethoxyethyl)amine so as to facilitate dissolution of the first reactant salt in the organic solvent, the first and second reactant salts being added to the organic solvent in relative amounts that are sufficient for reaction of the first and second reactant salts with each other to form a desired amount of the product compound;
   (b) allowing the first and second reactant salts to react with each other in the organic solvent to form a second crystallite that is insoluble in the organic solvent and that comprises crystals of the product compound that have a different habit or morphology from crystals of the product compound in the first crystallite that would otherwise be formable in water by reaction of similar amounts of the first and second reactant salts in water without the complexing agent.

* * * * *

UNITED STATES PATENT AND TRADEMARK OFFICE
CERTIFICATE OF CORRECTION

PATENT NO. : 5,545,394

DATED : August 13, 1996

INVENTOR(S) : Kenneth M. Doxsee

It is certified that error appears in the above-identified patent and that said Letters Patent is hereby corrected as shown below:

On the Cover Page:

[56] References Cited, U.S. Patent Documents, U.S. Patent No. 5,320,822, the date should be --6/1994--, and the inventors should be --Ozin et al.--.

In the Specification:

Column 1, line 61, "organoelement" should be -- organo-element --.

Column 4, line 34, "crownether" should be -- crown-ether --.

Column 4, line 67, "vander Waals" should be --van der Waals--.

Column 9, line 37, the sentence beginning with "Representative" should be indented so as to indicate the beginning of a paragraph.

Column 9, second column of Table I, "phosphorus" should be deleted.

Column 9, third column of Table I, "selenium", "sulfur", and "tellurium" should be deleted.

Column 9, second column of Table II, "hydrogen arsenate" should be --hydrogen arsenate ($HAsO_4^{2-}$)--.

Column 10, first column of Table II, "aluminum fluoride" should be --aluminum fluoride ($AlF_4^-$)--.

Column 10, first column of Table II, "bicarbonate" should be --bicarbonate ($HCO_3^-$)--.

Column 10, first column of Table II, "bismuth oxide" should be --bismuth oxide ($BiO_3^-$)--.

Column 10, first column of Table II, "cobalt oxide" should be --cobalt oxide ($CoO_2^-$)--.

Column 10, first column of Table II, "dibromide dioxide", "dichloride dioxide", "dithionate", and "iron oxide", should be deleted.

Column 10, second column of Table II, "hydrogen carbonate" should be deleted.

Column 10, second column of Table II, "hydrogen fluoride" should be --hydrogen fluoride ($HF_2^-$)--.

UNITED STATES PATENT AND TRADEMARK OFFICE
CERTIFICATE OF CORRECTION

PATENT NO.    : 5,545,394

DATED         : August 13, 1996

INVENTOR(S)   : Kenneth M. Doxsee

It is certified that error appears in the above-identified patent and that said Letters Patent is hereby corrected as shown below:

Column 10, second column of Table II, "hydrogen phosphate" should be --hydrogen phosphate ($HPO_4^{2-}$)--.

Column 10, second column of Table II, "hydrogen selenite" should be --hydrogen selenite ($HSeO_3^-$)--.

Column 10, second column of Table II, "hydrogen sulfate" should be --hydrogen sulfate ($HSO_4^-$)--.

Column 10, second column of Table II, "hydrogen sulfide" should be --hydrogen sulfide ($HS^-$)--.

Column 10, second column of Table II, "iron oxide" should be --iron oxide ($FeO_2^-$)--.

Column 10, second column of Table II, "niobium oxide" should be --niobium oxide ($NbO_3^-$)--.

Column 10, second column of Table II, "tantalum oxide" should be --tantalum oxide ($TaO_3^-$)--.

Column 10, second column of Table II, "molybdenum oxide" should be --molybdenum oxide ($MoO_4^{2-}$)--.

Column 10, second column of Table II, "tin oxide" should be --tin oxide ($SnO_3^{2-}$)--.

Column 10, second column of Table II, "titanium oxide" should be --titanium oxide ($Ti_3O_7^{2-}$)--.

Column 10, second column of Table II, "tungsten oxide" should be --tungsten oxide ($WO_4^{2-}$)--.

Column 10, second column of Table II, "vanadium oxide" should be --vanadium oxide ($VO_3^-$)--.

Column 10, second column of Table II, "zirconium oxide" should be --zirconium oxide ($ZrO_3^{2-}$)--.

Column 11, line 13, "nonlinear" should be -- non-linear --.

Column 11, line 48, "$Pb^+$" should be --$Pb^{2+}$--.

In the Claims:

Column 17, line 57, claim 1, "solvents" should be --solvent--.

Column 19, line 5, claim 10, --step, after-- should be added after "the".

Column 19, line 28, claim 12, "in the water" should be --in water--.

Signed and Sealed this

Second Day of February, 1999

Attest:

*Attesting Officer*

*Acting Commissioner of Patents and Trademarks*